US012626028B2

(12) United States Patent
Lee et al.

(10) Patent No.: US 12,626,028 B2
(45) Date of Patent: May 12, 2026

(54) METHOD AND SYSTEM FOR BUILDING DIGITAL TWIN MODELS

(71) Applicant: Hiwin Technologies Corp., Taichung City (TW)

(72) Inventors: Po-Lin Lee, Taichung City (TW); Hsien-Yu Chen, Taichung City (TW); Yu-Sheng Chiu, Taichung City (TW); Wen-Nan Cheng, Taichung City (TW); Chih-Chun Cheng, Taichung City (TW)

(73) Assignee: Hiwin Techologies Corp., Taichung City (TW)

( * ) Notice: Subject to any disclaimer, the term of this patent is extended or adjusted under 35 U.S.C. 154(b) by 1086 days.

(21) Appl. No.: 17/649,242

(22) Filed: Jan. 28, 2022

(65) Prior Publication Data
US 2023/0244826 A1 Aug. 3, 2023

(51) Int. Cl.
G06F 30/12 (2020.01)

(52) U.S. Cl.
CPC .................................... G06F 30/12 (2020.01)

(58) Field of Classification Search
CPC ....................................................... G06F 30/12
See application file for complete search history.

(56) References Cited

U.S. PATENT DOCUMENTS

| | | | | |
|---|---|---|---|---|
| 11,409,249 | B1 * | 8/2022 | Udengaard | G06F 30/20 |
| 12,061,845 | B2 * | 8/2024 | McGregor | G06F 30/18 |
| 2018/0018590 | A1 * | 1/2018 | Szeto | G16H 10/60 |
| 2020/0220906 | A1 * | 7/2020 | Port | H04L 65/762 |
| 2021/0141870 | A1 * | 5/2021 | McGregor | G06F 30/12 |
| 2021/0262990 | A1 * | 8/2021 | Kim | G01H 13/00 |

FOREIGN PATENT DOCUMENTS

| | | | | | |
|---|---|---|---|---|---|
| CN | 101417393 | A | * | 4/2009 | |
| CN | 105426628 | B | * | 6/2018 | G06F 30/367 |
| CN | 113421329 | A | * | 9/2021 | G06T 17/00 |
| CN | 113946922 | A | * | 1/2022 | G06F 30/20 |
| EP | 3809305 | A1 | * | 4/2021 | G06F 30/23 |

OTHER PUBLICATIONS

Soonjo Kwon, Hyunoh Lee & Duhwan Mun, Semantics-aware adaptive simplification for lightweighting diverse 3D CAD models in industrial plants, Journal of Mechanical Science and Technology, Jan. 2, 2020, 34(3) 2020, Springer, Korea.
Qingqing Feng, Xionghui Zhou & Junjie Li, A hybrid automated approach to adapt geometry model for CAD/CAE integration, Engineering with Computers, Feb. 9, 2019, 36:543-563 2020, Springer, China.

* cited by examiner

*Primary Examiner* — Rehana Perveen
(74) *Attorney, Agent, or Firm* — Wang Law Firm, Inc.

(57) ABSTRACT
A method and a system for building digital twin models allow the setting of a shape and dimensions of a simplified geometric solid corresponding to a component of a feeding system; after sampling the solid to obtain second position data, calculates a set of model eigenvalues and a set of model eigenvectors by a modal analysis method according to a material data of the component, the second position data and second size data of the solid; and defines the solid as a digital twin model of the component when it is determined by a modal verification method that a set of actual eigenvectors of the component is similar to the set of model eigenvectors. Data amounts of the second position and size data are far less than data amounts of first position and size data of an image of the component.

8 Claims, 8 Drawing Sheets

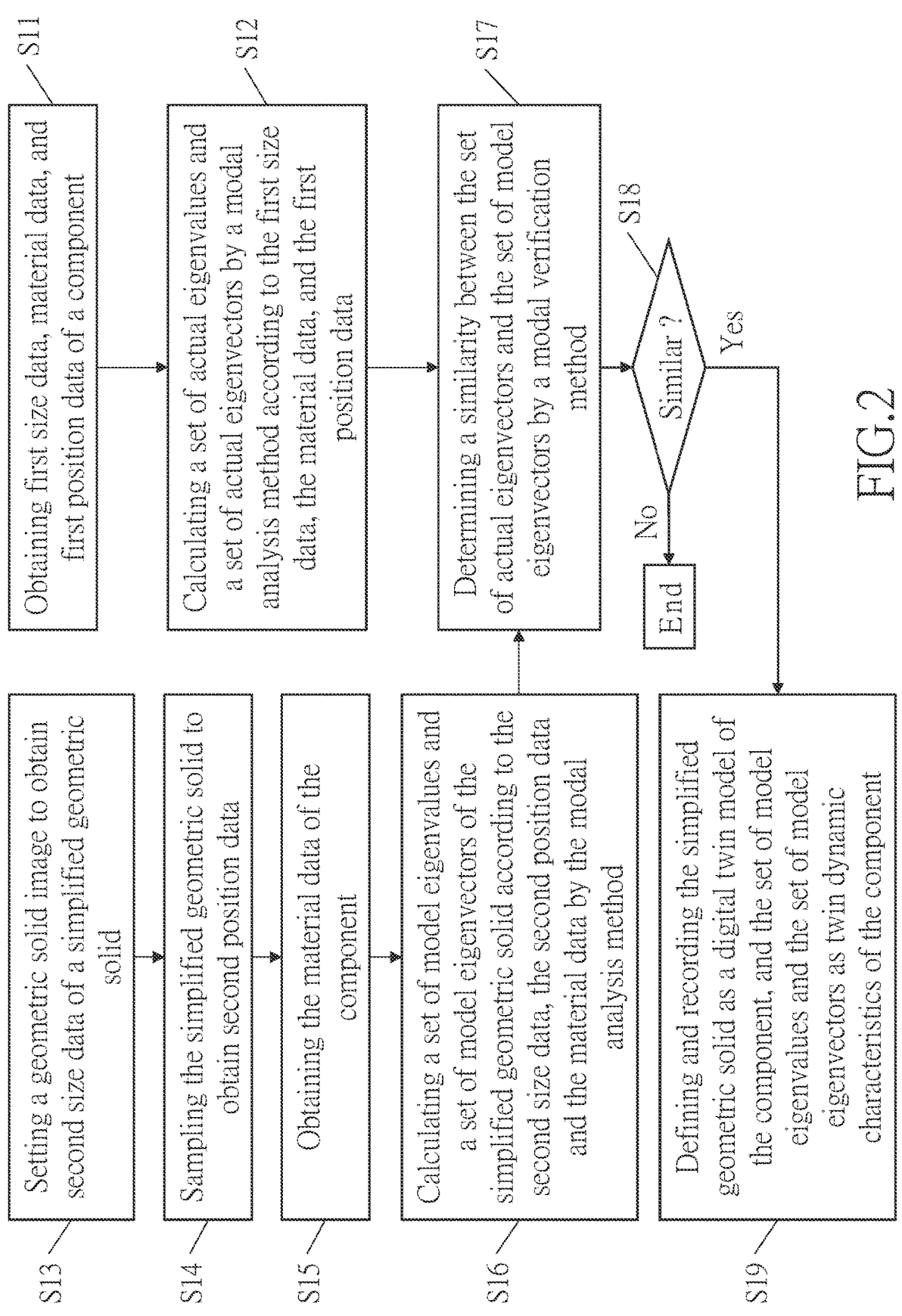

S11 Obtaining first size data, material data, and first position data of a component S12 Calculating a set of actual eigenvalues and a set of actual eigenvectors by a modal analysis method according to the first size data, the material data, and the first position data S17 Determining a similarity between the set of actual eigenvectors and the set of model eigenvectors by a modal verification method S18 Similar ?
No
Yes End S13 Setting a geometric solid image to obtain second size data of a simplified geometric solid S14 Sampling the simplified geometric solid to obtain second position data S15 Obtaining the material data of the component S16 Calculating a set of model eigenvalues and a set of model eigenvectors of the simplified geometric solid according to the second size data, the second position data and the material data by the modal analysis method S19 Defining and recording the simplified geometric solid as a digital twin model of the component, and the set of model eigenvalues and the set of model eigenvectors as twin dynamic characteristics of the component

FIG.2

S31

Obtaining a component image of the component

S32

Spatially discretizing the component image into first image blocks

S33

Defining pixel coordinates of vertexes of the first image blocks as the first position data

Spatially discretizing a simplified geometric solid into second image blocks

S42

Defining pixel coordinates of vertexes of the second image blocks as the second position data

FIG.4

METHOD AND SYSTEM FOR BUILDING DIGITAL TWIN MODELS

BACKGROUND OF THE INVENTION

Field of Invention

The invention relates to a digital twin technology, and more particularly to a method and a system for building digital twin models.

Description of Related Art

Digital twin technology has gradually been applied to industry in recent years. Digital twin technology can be used to build a virtual model of a physical object, and there is connectivity between the physical object and the virtual model. The real-time data returned by a sensing unit can be serially processed, analyzed, and judged, so that the virtual model can generate feedback.

However, the amount of data of the virtual model is generally very large, and a huge amount of data computation is required to obtain the feedback result of the virtual model. Therefore, not only a huge operational processing resource is required, but also such a virtual model is not conducive to the evaluation of whether a component used as the physical object can be applied to machines of different specifications.

Related patents are CN112292702A, TWI668584 and CN112487584.

SUMMARY OF THE INVENTION

Therefore, an object of the present invention is to provide a method and a system for building digital twin models, and the method and system are capable of greatly reducing an amount of data of a virtual model corresponding to a physical object and speeding up the building of the virtual model.

Another object of the present invention is to provide a method and a system for building digital twin models, and the method and system are capable of greatly reducing a demand for operational processing resources.

Yet another object of the invention is to provide a method and a system for building digital twin models, a virtual model generated using the method and the system is conducive to the evaluation of whether a component used as the physical object can be applied to machines of different specifications.

A method for building digital twin models provided by one embodiment of the present invention is applicable for building a digital twin model of at least one component of a feeding system, the component has a set of actual eigenvalues and a set of actual eigenvectors corresponding to the set of actual eigenvalues, and the method for building the digital twin model is executed by at least one processor and includes following steps of: (A) receiving a user setting from a user interface, setting a geometric solid image according to the user setting, a contour of a simplified geometric solid of the geometric solid image corresponding to a contour of the component, and the user setting associating with a shape and a size of the simplified geometric solid; (B) sampling the simplified geometric solid of the geometric solid image to obtain second position data; (C) obtaining material data of the component from a database; (D) calculating a set of model eigenvalues and a set of model eigenvectors by a modal analysis method according to second size data of the simplified geometric solid, the second position data and the material data; (E) determining a similarity between the set of actual eigenvectors and the set of model eigenvectors by a modal verification method; and (F) when determining that the set of actual eigenvectors being similar to the set of model eigenvectors, defining the simplified geometric solid as the digital twin model of the component, and defining the set of model eigenvalues and the set of model eigenvectors as twin dynamic characteristics of the component. A data amount of the second size data of the geometric solid image is less than a data amount of first size data of the component, a data amount of the second position data is less than a data amount of first position data of the component, and the first size data and the first position data are stored in the database and are obtained from a component image of the component.

In some embodiments, the set of actual eigenvalues and the set of actual eigenvectors are calculated by the modal analysis method based on the first size data, the material data, and the first position data.

In some embodiments, the step (B) and obtaining the first position data from the component image are performed by a finite element method (FEM) or continuum mechanics.

In some embodiments, the step (B) includes following steps of: (B1) discretizing the simplified geometric solid into a plurality of second image blocks; and (B2) defining pixel coordinates of vertexes of the plurality of second image blocks as the second position data.

In some embodiments, obtaining the first position data from the component image includes following steps of: (G) discretizing the component image into a plurality of first image blocks; and (H) defining pixel coordinates of vertexes of the plurality of first image blocks as the first position data.

In some embodiments, the modal verification method is modal assurance criterion (MAC), mean phase deviation (MPD) or modal phase collinearity (MPC).

In some embodiments, the simplified geometric solid is a cube, a cuboid, a flat plate, or a cylinder.

In some embodiments, the component is a transmission element or a work platform, and the transmission element is a bearing, a ball screw, a rotary table or a linear guideway.

A system for building digital twin models provided by one embodiment of the present invention, includes at least one processor configured to execute the method for building the digital twin model.

BRIEF DESCRIPTION OF THE DRAWINGS

After studying the detailed description in conjunction with the following drawings, other aspects and advantages of the invention will be discovered:

FIG. 2 is a flowchart of a method for building digital twin models according to one embodiment of the present invention;

FIG. 3 is a flowchart of a method for obtaining first position data according to one embodiment of the present invention;

FIG. 4 is a flowchart of a method for obtaining second position data according to one embodiment of the present invention;

DETAILED DESCRIPTION OF THE INVENTION

Figure 1:
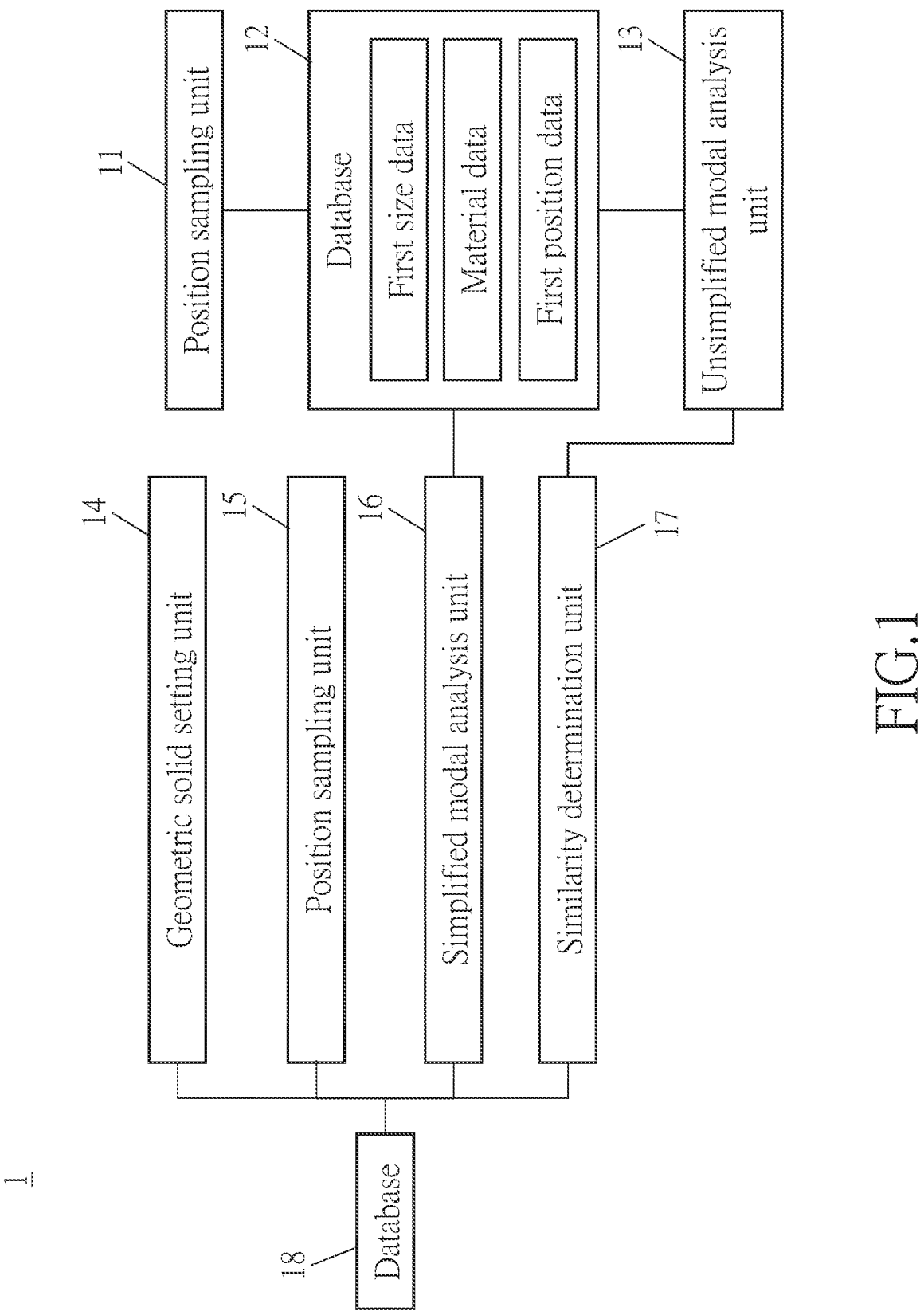
FIG. 1 is a functional block diagram of a system for building digital twin models according to one embodiment of the present invention.
Figure 5:
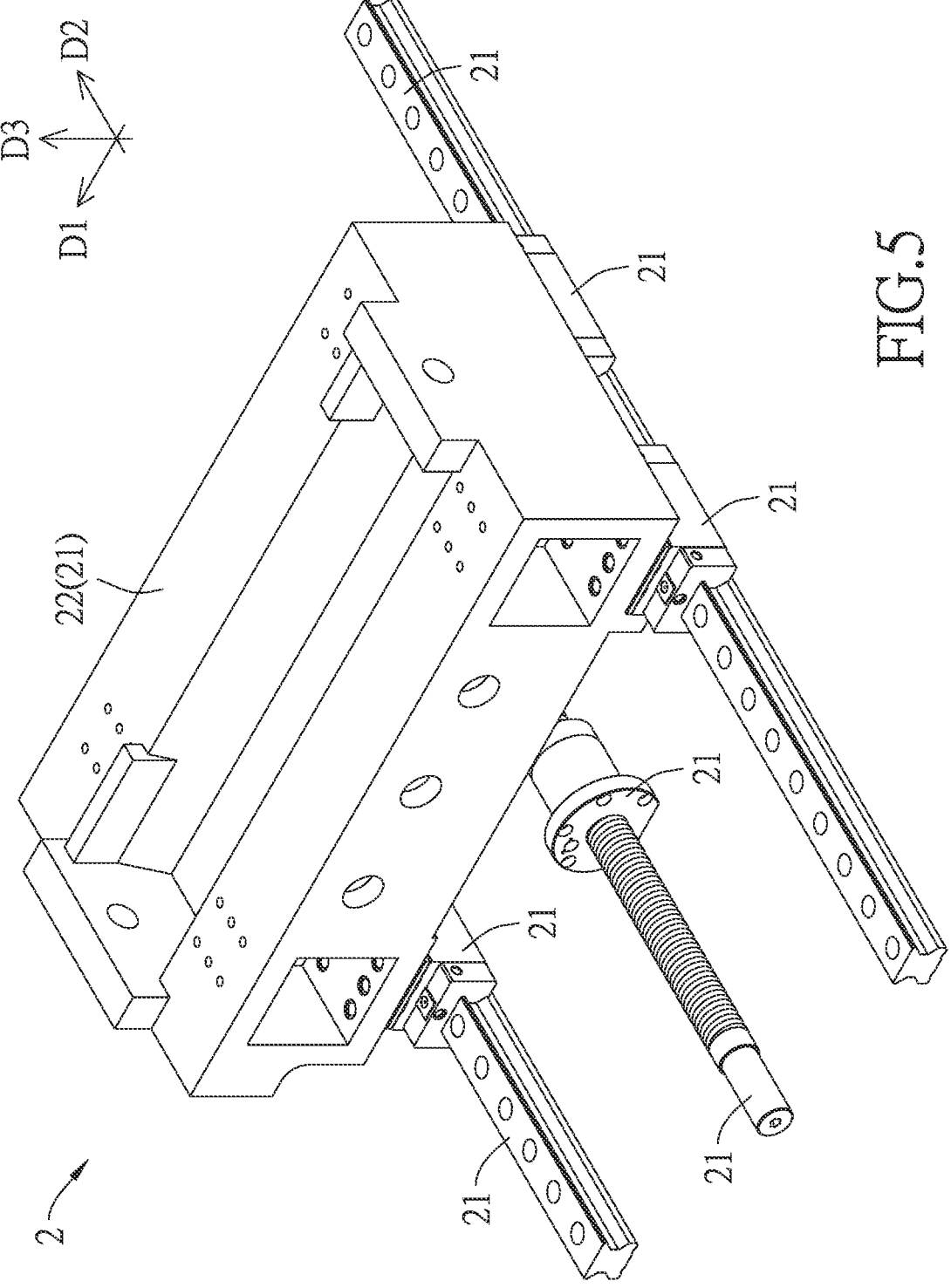
FIG. 5 is a perspective view of a feeding system of a machine according to one embodiment of the present invention.
Figure 6:
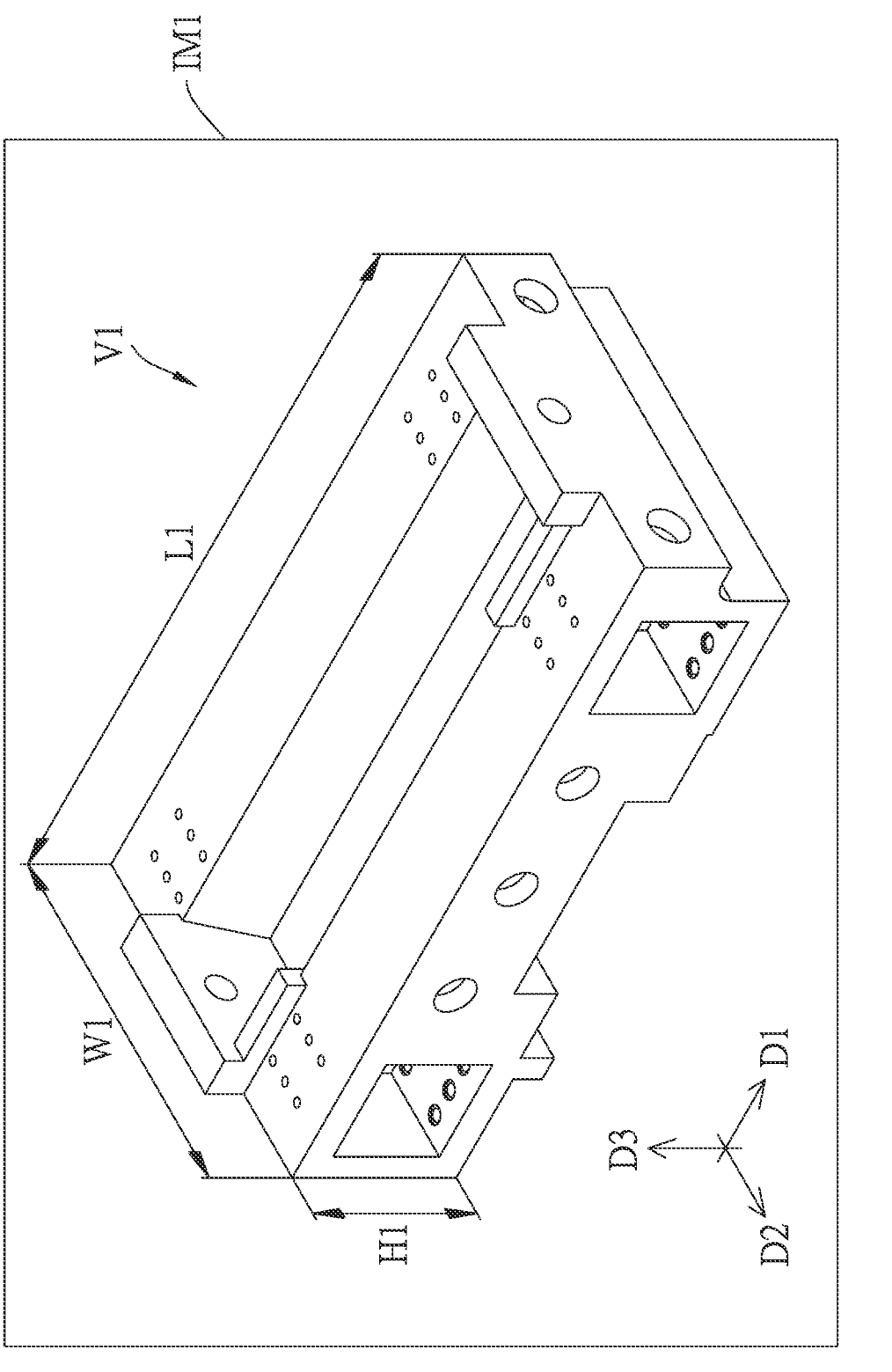
FIG. 6 is a perspective view of a component image of a work platform of the feeding system of FIG. 5 according to one embodiment of the present invention.
Figure 7:
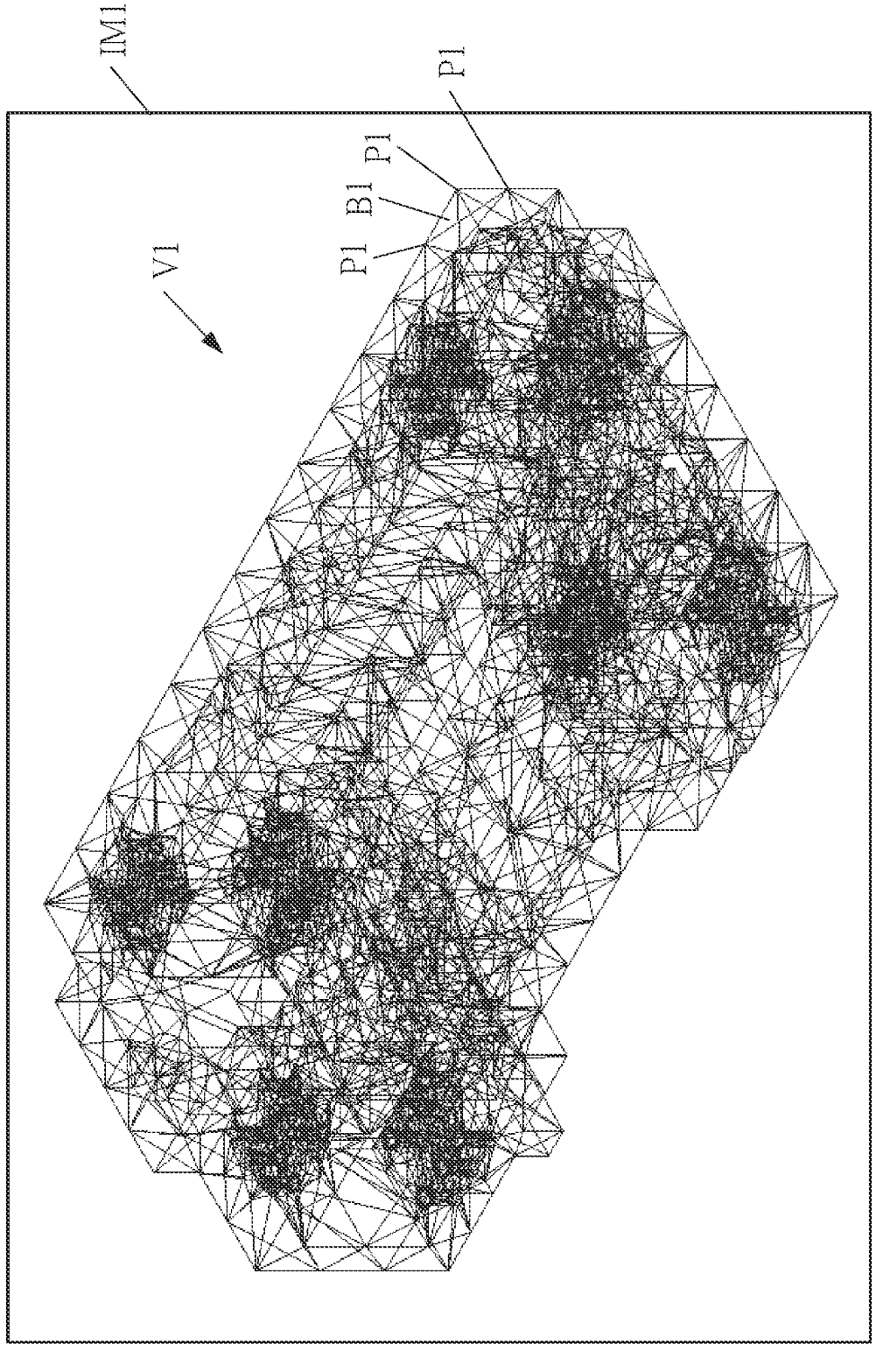
FIG. 7 is a schematic diagram of the component image of FIG. 6 after being discretized according to one embodiment of the present invention.

In the following detailed description, many specific details are set forth in order to provide a thorough understanding of the invention. However, those of ordinary skill in the art will understand that the invention can be practiced without these specific details. In other cases, well-known methods, procedures and/or elements have not been described in detail so as not to obscure the invention.

Please refer to FIGS. 1 to 9, illustrating a method for building digital twin models (hereinafter abbreviated as building method) and a system 1 for building digital twin models (hereinafter abbreviated as system 1) provided by one embodiment of the present invention. The building method is executed by the system 1; and the system 1 is applicable for building a virtual model of at least one component 21 of a feeding system 2 of a machine through the digital twin technology, and finding out twin dynamic characteristics of the virtual model. The component 21 can be, for example, but not limited to, a transmission element, such as a bearing, a ball screw, a rotary table or a linear slide, or a work platform 22. In order to clearly illustrate the spirit of the present invention, the following will take the work platform 22 as an example of the component 21 for illustration.

The system 1 can be implemented in one server, or the system 1 can be implemented in a distributed manner in multiple servers capable of communicating with one another. The system 1 includes at least one processor and at least one storage device capable of communicating with each of the at least one processor. The system 1 is installed with several software applications, so that the at least one storage device, the at least one processor and the software applications in operation can be planned to cooperatively form a position sampling unit 11, a database 12, an unsimplified modal analysis unit 13, a geometric solid setting unit 14, a position sampling unit 15, a simplified modal analysis unit 16, a similarity determination unit 17, and a database 18. The position sampling unit 11 and the unsimplified modal analysis unit 13 are capable of communicating with the database 12; the geometric solid setting unit 14, the position sampling unit 15, the simplified modal analysis unit 16, the similarity determination unit 17, and the database 18 are capable of communicating with one another; the similarity determination unit 17 is capable of communicating with the unsimplified modal analysis unit 13; and simplified modal analysis unit 16 is capable of communicating with the database 12.

The method for building a digital twin model of the work platform 22 (i.e., the building method provided by the invention) includes following steps, for example, but is not limited to the steps.

Firstly, in step S11, the unsimplified modal analysis unit 13 obtains first size data, material data, and first position data of the work platform 22 from the database 12. The first size data, the material data, and the first position data of the work platform 22 are pre-stored in the database 12, and the database 12 also records corresponding relationships between the first size data, the material data, and the first position data. The first size data can be created or set by drawing a component image IM1 of the work platform 22 by, for example, but not limited to, a drawing software application (for example, but not limited to, AutoCAD) installed in the system 1. The component image IM1 is a three-dimensional image, and an image V1 of the work platform 22 is displayed in the component image IM1. The first size data can include, for example, but not limited to, data about a length L1 (for example, 730 mm) of the image V1 in an axial direction D1, data about a width W1 (for example, 375 mm) of the image V1 in an axial direction D2, data about a height H1 (for example, 170 mm) of the image V1 in an axial direction D3, and data about a perforation diameter and a groove depth of the image V1, and each of the sizes is not limited to actual size or image scale size. The axial directions D1~D3 are perpendicular to one another. The material data can include, for example, but not limited to, density and Young's modulus. The first position data can be obtained by, for example, but not limited to, sampling pixel coordinates of the component image IM1.

The method for obtaining the first position data can be realized by a finite element method (FEM) or continuum mechanics. In the case of using the finite element method as an example as shown in FIGS. 1, 3, 6 and 7, firstly, in step S31, the position sampling unit 11 obtains the component image IM1 of the work platform 22 from the at least one storage device. Then, in step S32, the position sampling unit 11 spatially discretizes (i.e., dividing by grids) the image V1 of the work platform 22 in the component image IM1 to obtain a plurality of first image blocks B1 (or can be called sub-regions or elements) through a drawing software application (for example, but not limited to, AutoCAD) or a computer aided engineering (CAE) software application (for example, but not limited to, an analysis software application launched by ANSYS) installed in the system 1. A grid shape for the first image blocks B1 is, for example, but not limited to, a triangle or a square. In this embodiment, the grid shape for the first image blocks B1 is a triangle. Then, in step S33, the position sampling unit 11 defines pixel coordinates of vertexes P1 (or called nodes or discrete points) of the first image blocks B1 as the first position data of the work platform 22. Finally, the position sampling unit 11 stores the first position data in the database 12.

After the unsimplified modal analysis unit 13 obtains the first size data, the material data, and the first position data, the unsimplified modal analysis unit 13 in step S12 calculates a set of actual eigenvalues (i.e., actual eigenvalue data) and a set of actual eigenvectors (i.e., actual eigenvector data) of the work platform 22 by a modal analysis method through a CAE software application installed in the system 1 according to the first size data, the material data, and the first position data. The set of actual eigenvalues is a plurality of natural frequencies of the work platform 22, and the set of actual eigenvectors is a plurality of modes of the work platform 22. The set of actual eigenvalues and the set of actual eigenvectors are dynamic characteristics of the work platform 22.

In step S12, after a geometric shape, the first size data, the first position data, the material data (such as density and Young's modulus) and a density formula are known, an equation (1) related to the discretized image V1 can be obtained through the modal analysis method:

$$[M]\{\ddot{u}\}+[K]\{u\}=\{0\} \tag{1}$$

wherein [M] is a mass matrix, [K] is a rigid matrix, {u} is a set of displacements of the vertexes P1 after the discretization of the image V1, and {ü} is a set of accelerations of the vertexes P1 after the discretization of the image V1. Assume that the system 1 has two vertices P1, the mass matrix [M] and the rigid matrix [K] can be expressed as:

$$[M] = \begin{bmatrix} m_1 & 0 \\ 0 & m_2 \end{bmatrix} \quad (2)$$

$$[K] = \begin{bmatrix} k_1 + k_3 & -k_3 \\ -k_3 & k_2 + k_3 \end{bmatrix} \quad (3)$$

In order to solve the equation (1), {u} can be assumed to be $\{\emptyset\}_i \times \sin(\omega_i t + \theta_i)$, and {ü} can be assumed to be $$-\omega_i^2 \times \{\emptyset\}_i \times \sin(\omega_i t + \theta_i),$$

so the equation (1) can be simplified as:

$$\left([K] - \omega_i^2[M]\right) \times \{\emptyset\}_i = \{0\} \quad (4)$$

wherein $\omega_i$ is a natural frequency of the image V1, and $\{\emptyset\}_i$ is a set of modes of the image V1. Through solving a determinant $\det[K-\omega^2 M]=0$, the natural frequency $\omega_i$ and a set of modes $\{\emptyset\}_i$ can be found.

Figure 8:
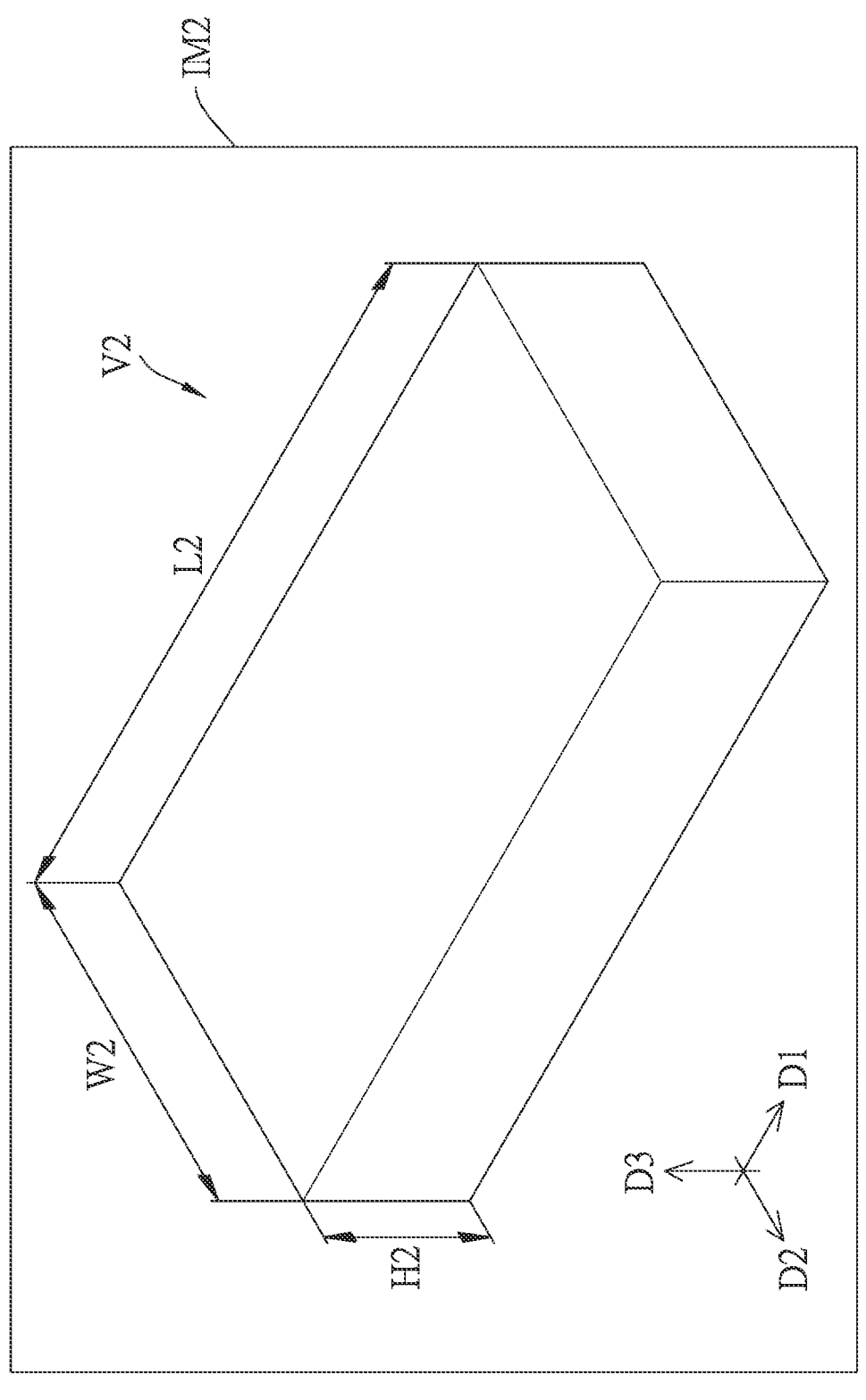
FIG. 8 is a schematic diagram of a geometric solid image according to one embodiment of the present invention.
Figure 9:
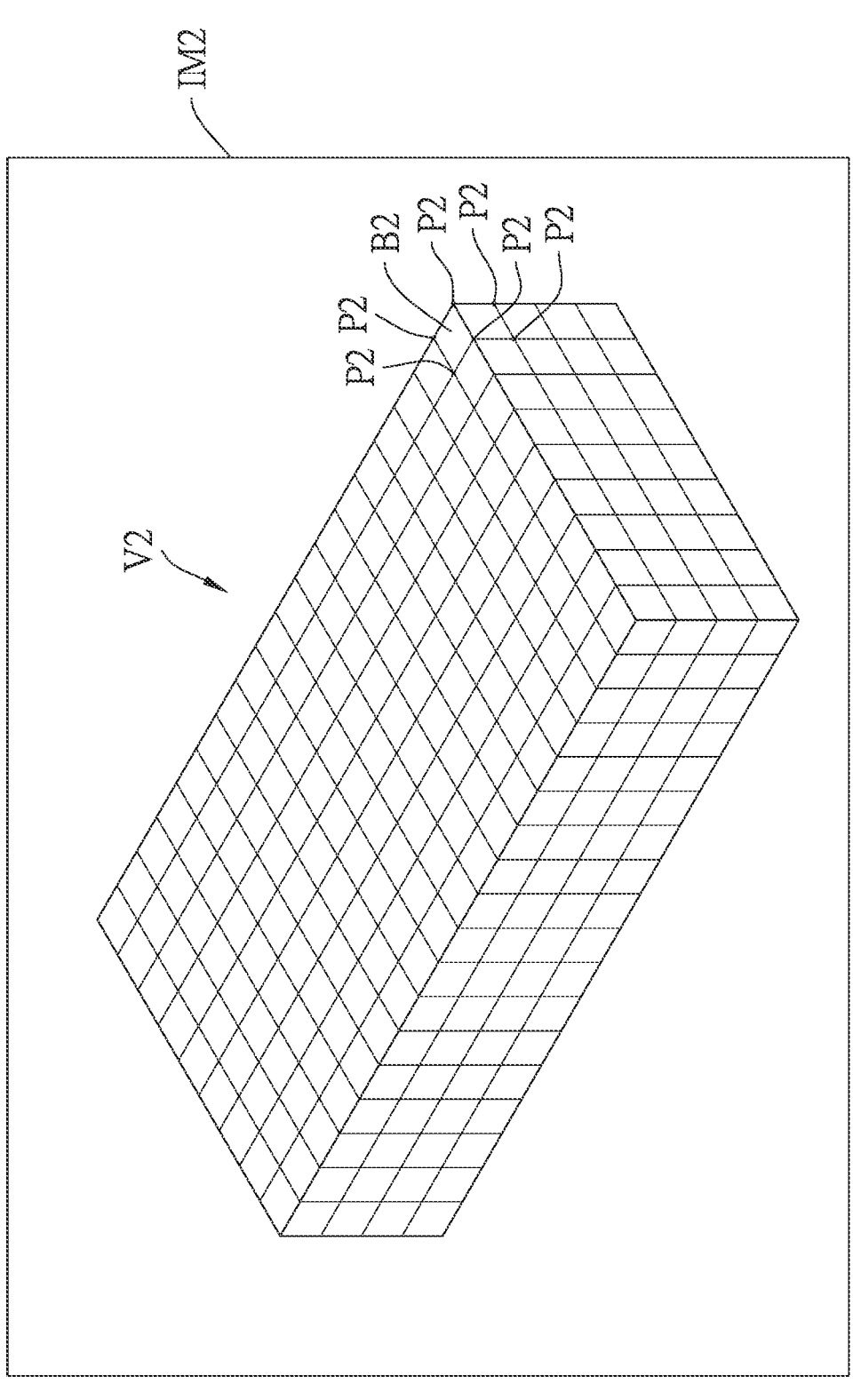
FIG. 9 is a schematic diagram of the geometric solid image of FIG. 8 after being discretized according to one embodiment of the present invention.

On the other hand, in step S13, the geometric solid setting unit 14 receives a user setting from a user interface, and sets a geometric solid image IM2 corresponding to a contour of the work platform 22 according to the user setting, as shown in FIG. 8. The user setting associates with a shape type and a size of a simplified geometric solid V2 displayed in the geometric solid image IM2. The user interface can be provided by, for example, but not limited to, the geometric solid setting unit 14 in conjunction with a CAE software application, and is displayed on a display device communicating with the at least one processor. For example, through an input device (for example, but not limited to, a keyboard, a mouse, or a touch panel of a display device) that communicates with the at least one processor, a user can select one (option of a cuboid) of shape options of a virtual model presented on the user interface according to a rough contour of the work platform 22 (for example, the work platform 22 looking like a cuboid (i.e., shape type)); and according to the first size data (for example, but not limited to, the data about the length L1, the width W1 and the height H1 of the image V1) of the work platform 22, the user can also input dimensions (for example, but not limited to, a length L2 of 730 mm in the axial direction D1, a width W2 of 375 mm in the axial direction D2, and a height H2 of 170 mm in the axial direction D3) required by the simplified geometric solid V2 with a shape of a cuboid. The input of the shape and the dimensions is the user setting and is sent to the geometric solid setting unit 14. At this time, according to the user setting, the geometric solid setting unit 14 is capable of defining (specifically, programmatically construct) the simplified geometric solid V2 that is cuboid-shaped and shown in a geometric solid image IM2, as the digital twin model of the work platform 22, and defining the dimensions (that is, second size data) of the simplified geometric solid V2. Since the simplified geometric solid V2 is a simplified virtual model of the work platform 22, the shape and structure of the simplified geometric solid V2 have omitted many structural features (for example, but not limited to, perforation(s), groove(s) and rib(s)) in the work platform 22 that unlikely affect the dynamic characteristics. Therefore, a data amount of the second size data of the simplified geometric solid V2 is far less than a data amount of the first size data of the work platform 22.

Then, in step S14, the position sampling unit 15 obtains the geometric solid image IM2 from the geometric solid setting unit 14, and samples (or discretizes) the geometric solid image IM2 to obtain second position data of the simplified geometric solid V2. The sampling method can be realized by, for example, but not limited to, the finite element method or the boundary element method. Taking the finite element method as an example for sampling, as shown in FIGS. 1, 4, 8 and 9, the position sampling unit 15 discretizes the simplified geometric solid V2 in the geometric solid image IM2 into a plurality of second image blocks B2 in step S41, and then in step S42, defines pixel coordinates of vertexes P2 of the second image blocks B2 as the second position data. In this embodiment, a shape of the second image block B2 is a cube. However, in other embodiments, the second image blocks B2 can also have the same shape as the first image blocks B1, and even a size of the second image blocks B2 can be the same as or different from a size of the first image blocks B1. Since the shape and the structure of the simplified geometric solid V2 have omitted many structural features in the work platform 22 that unlikely affect the dynamic characteristics, a data amount of the second position data of the simplified geometric solid V2 is also far less than a data amount of the first position data of the work platform 22.

Then, the simplified modal analysis unit 16 obtains the material data from the database 12 in step S15, and obtains the second size data from the geometric solid setting unit 14 and the second position data from the position sampling unit 15 in step S16, and then adopts the same method as what the unsimplified modal analysis unit 13 uses, i.e., the modal analysis method, to calculate a set of model eigenvalues and a set of model eigenvectors of the simplified geometric solid V2 based on the second size data, the second position data and the material data. The model eigenvalues are natural frequencies of the simplified geometric solid V2, and the model eigenvectors are modes of the simplified geometric solid V2.

After the unsimplified modal analysis unit 13 calculates and obtains the set of actual eigenvalues and the set of actual eigenvectors, and the simplified modal analysis unit 16 calculates and obtains the set of model eigenvalues and the set of model eigenvectors, the similarity determination unit 17 in step S16 obtains the set of actual eigenvectors from the unsimplified modal analysis unit 13 and the set of model eigenvectors from the simplified modal analysis unit 16, and then determines a similarity between the set of actual eigenvectors and the set of model eigenvectors by a modal verification method. The modal verification method can be, for example, but not limited to, a modal assurance criterion, a mean phase deviation method, or a modal phase collinearity method.

Taking the modal assurance criterion as an example for calculating the similarity, the similarity can be calculated by the following formula (5), wherein MAC(r,q) represents the similarity; $\emptyset_r$ represents a matrix of the set of actual eigenvectors; $\emptyset_q$ represents a matrix of the set of model eigenvectors;

$$\phi_r^T$$

represents a transposed matrix of the set of actual eigenvectors; and $$\phi_q^T$$

represents a transposed matrix of the set of model eigenvectors. When the similarity is greater than or equal to a threshold value (for example, but not limited to, 0.8), it means that the set of actual eigenvectors is similar to the set of model eigenvectors. Conversely, when the similarity is less than the threshold value, it means that the set of actual eigenvectors is not similar to the set of model eigenvectors.

$$MAC(r, q) = \frac{|\phi_r^T \phi_q|^2}{(\phi_r^T \phi_r) \times (\phi_q^T \phi_q)} \tag{5}$$

Then, in step S18, when the similarity determination unit 17 determines that the set of actual eigenvectors is similar to the set of model eigenvectors, it means that the current simplified geometric solid V2 can be equivalent to the work platform 22. At this time, the similarity determination unit 17 in step S19 defines the simplified geometric solid V2 as the digital twin model of the work platform 22 and defines the set of model eigenvalues and the set of model eigenvectors as the twin dynamic characteristics of the work platform 22. In addition, in step S19, the similarity determination unit 17 also tells the geometric solid setting unit 14 to store the geometric solid image IM2 and its second size data in the database 18, tells the position sampling unit 15 to store the second position data in the database 18, and tells the simplified modal analysis unit 16 to store the twin dynamic characteristics and the material data in the database 18. And, the database 18 also records corresponding relationships between the geometric solid image IM2, the second size data, the second position data, the material data, and the twin dynamic characteristics.

Conversely, in step S18, when the similarity determination unit 17 determines that the set of actual eigenvectors is not similar to the set of model eigenvectors, it means that the current simplified geometric solid V2 cannot be equivalent to the work platform 22, so that the similarity determination unit 17 do not define the simplified geometric solid V2 as the digital twin model of the work platform 22, and do not define the set of model eigenvalues and the set of model eigenvectors as the twin dynamic characteristics of the work platform 22.

Through the procedure of the above steps S13 to S16, the present invention is capable of greatly reducing an amount of data of the virtual model and speeding up the building of the virtual model while greatly reducing a demand for operational processing resources, so that the virtual model is conductive to the evaluation of whether the work platform 22 can be applied to machines of different specifications.

Through the verification process of the above steps S17 to S18, the present invention enables that the virtual model with a less data volume can still be equivalent to the work platform 22.

Although the execution sequence of steps S13 to S16 in the above embodiment is independent of steps S11 to S12, the present invention is not limited to this example of the process. In other embodiments, steps S13 to S16 can be performed at any time point before step S17.

In addition, although the above-mentioned embodiments use the work platform 22 as an example for illustration, the system 1 and the method provided by the present invention can also be applied to building digital twin models and their twin dynamic characteristics of other components (for example, but not limited to, a screw) of the feeding system 2, or can also be applied to building digital twin models and their twin dynamic characteristics of components of other devices in the machine other than the feeding system 2.

Although the databases 12 and 18 of the above embodiments are set up separately, the present invention is not limited to this implementation mode. In other embodiments, the databases 12 and 18 can also be integrated into one instead.

Although the specific embodiments of the invention are disclosed in the above implementation modes, they are not intended to limit the invention. The specification relating to the above embodiments should be construed as exemplary rather than as limitative of the invention, with many variations and modifications being readily attainable by a person having ordinary skill in the art to which the invention pertains without departing from the principles and spirit thereof as defined by the appended claims and their legal equivalents.

What is claimed is:

1. A method for building digital twin models, the method being applicable for building a digital twin model of at least one component of a feeding system, the component having a set of actual eigenvalues and a set of actual eigenvectors corresponding to the set of actual eigenvalues, and the method comprising following steps of:

(A) receiving a user setting from a user interface by a geometric solid setting unit;

(B) programmatically constructing a simplified geometric solid shown in a geometric solid image according to the user setting which includes a selection of shape type and a setting of size for the simplified geometric solid shown in the geometric solid image;

(C) sampling the simplified geometric solid of the geometric solid image by a position sampling unit to obtain second position data;

(D) obtaining material data of the component from a database by a simplified modal analysis unit;

(E) calculating a set of model eigenvalues and a set of model eigenvectors by a modal analysis method according to second size data of the simplified geometric solid, the second position data and the material data by the simplified modal analysis unit;

(F) determining a similarity between the set of actual eigenvectors and the set of model eigenvectors, by the simplified modal analysis unit, by a modal verification method; and (G) defining the simplified geometric solid as the digital twin model of the component and defining the set of model eigenvalues and the set of model eigenvectors as twin dynamic characteristics of the component by the simplified modal analysis unit when determining that the set of actual eigenvectors being similar to the set of model eigenvectors;

wherein the component is a transmission element or a work platform, and the transmission element is a bearing, a ball screw, a rotary table or a linear guideway, a data amount of the second size data is less than a data amount of a first size data of the component, a data amount of the second position data is less than a data amount of first position data of the component, and the first size data and the first position data are stored in the database and are obtained from a component image of the component.

2. The method for building the digital twin models as claimed in claim 1, wherein the set of actual eigenvalues and the set of actual eigenvectors are calculated by the modal analysis method based on the first size data, the material data, and the first position data.

3. The method for building the digital twin models as claimed in claim 1, wherein the step (C) and obtaining the first position data from the component image are performed by a finite element method or continuum mechanics.

4. The method for building the digital twin models as claimed in claim 1, wherein the step (C) comprises following steps of:

(C1) discretizing the simplified geometric solid into a plurality of second image blocks; and (C2) defining pixel coordinates of vertexes of the plurality of second image blocks as the second position data.

5. The method for building the digital twin models as claimed in claim 1, wherein obtaining the first position data from the component image comprises following steps of:

(H) discretizing the component image into a plurality of first image blocks by the position sampling unit; and (I) defining pixel coordinates of vertexes of the plurality of first image blocks as the first position data by the position sampling unit.

6. The method for building the digital twin models as claimed in claim 1, wherein the modal verification method is modal assurance criterion.

7. The method for building the digital twin models as claimed in claim 1, wherein the simplified geometric solid is a cube, a cuboid, a flat plate, or a cylinder.

8. A system for building digital twin models, comprising at least one processor configured to execute the method for building the digital twin models as claimed in claim 1.

* * * * *